United States Patent [19]

Cho et al.

[11] Patent Number: 5,441,568
[45] Date of Patent: Aug. 15, 1995

[54] EXHAUST BAFFLE FOR UNIFORM GAS FLOW PATTERN

[75] Inventors: Tom Cho, San Francisco; Christopher Ngai, Burlingame, both of Calif.

[73] Assignee: Applied Materials, Inc., Santa Clara, Calif.

[21] Appl. No.: 276,152

[22] Filed: Jul. 15, 1994

[51] Int. Cl.⁶ .............................................. C23C 16/00
[52] U.S. Cl. .................... 118/715; 118/728; 118/729; 156/345; 204/298.01; 204/298.07; 427/248.1; 437/225
[58] Field of Search ............... 118/715, 724, 725, 728; 156/345; 427/248.1; 204/298.01, 298.02, 298.07, 298.31

[56] References Cited

U.S. PATENT DOCUMENTS

| | | | |
|---|---|---|---|
| 4,209,357 | 6/1980 | Gorin et al. | 156/643 |
| 4,534,816 | 8/1985 | Chen et al. | 156/345 |
| 4,590,042 | 5/1986 | Drage | 422/186.06 |
| 4,792,378 | 12/1988 | Rose et al. | 156/643 |
| 4,854,263 | 8/1989 | Chang | 118/715 |
| 5,000,113 | 3/1991 | Wang | 118/723 |
| 5,155,331 | 10/1992 | Horiuchi | 219/121.43 |
| 5,292,554 | 3/1994 | Sinha | 427/251 |
| 5,304,248 | 4/1994 | Cheng | 118/728 |
| 5,328,722 | 7/1994 | Ghanayem | 427/250 |

FOREIGN PATENT DOCUMENTS

0090169  4/1993  Japan ................. 204/298.07

Primary Examiner—R. Bruce Breneman
Assistant Examiner—Jeffrie R. Lund
Attorney, Agent, or Firm—Michael A. Glenn

[57] ABSTRACT

An arc shaped exhaust baffle having two ends that define a gap therebetween that is not directly accessible by the exhaust plenum, that provides improved process gas flow distribution in a semiconductor process chamber, has a plurality of apertures formed therethrough and distributed about a baffle circumference. The apertures communicate with an underlying exhaust plenum to generate a uniform gas flow across the substrate surface during substrate processing. The exhaust baffle has at least one offset passage formed therethrough that may be adapted to draw process gas across a substrate surface at an acute angle relative thereto from the gap, and thereby provide an exhaust pattern that influences the process gas flow about the entire circumference of the substrate. An alternative embodiment of the invention provides a exhaust baffle having two baffle sections in facing abutment with one another that define a plurality of apertures and at least one offset passage for conducting process gas from the process chamber from the gap.

19 Claims, 8 Drawing Sheets

EXHAUST BAFFLE FOR UNIFORM GAS FLOW PATTERN

BACKGROUND OF THE INVENTION

1. Technical Field

The invention relates to semiconductor process chambers. More particularly, the invention relates to establishing optimum gas flow patterns in semiconductor process chambers.

2. Description of the Prior Art

A critical goal when processing semiconductor substrates in a semiconductor process chamber is to deposit a uniform film of a desired material on the substrate surface. However, known substrate deposition processes do not produce optimal film uniformity, for example as indicated by the film refractive index, which is a measure of the uniformity of the thickness and composition of the film. Lack of film uniformity results in a processed substrate on which there is a variation across the substrate in the electrical properties of the individual devices fabricated thereon. It is thought that lack of uniformity in process gas flow patterns across the substrate surface during substrate processing may be one cause of poor film uniformity.

Figure 1:
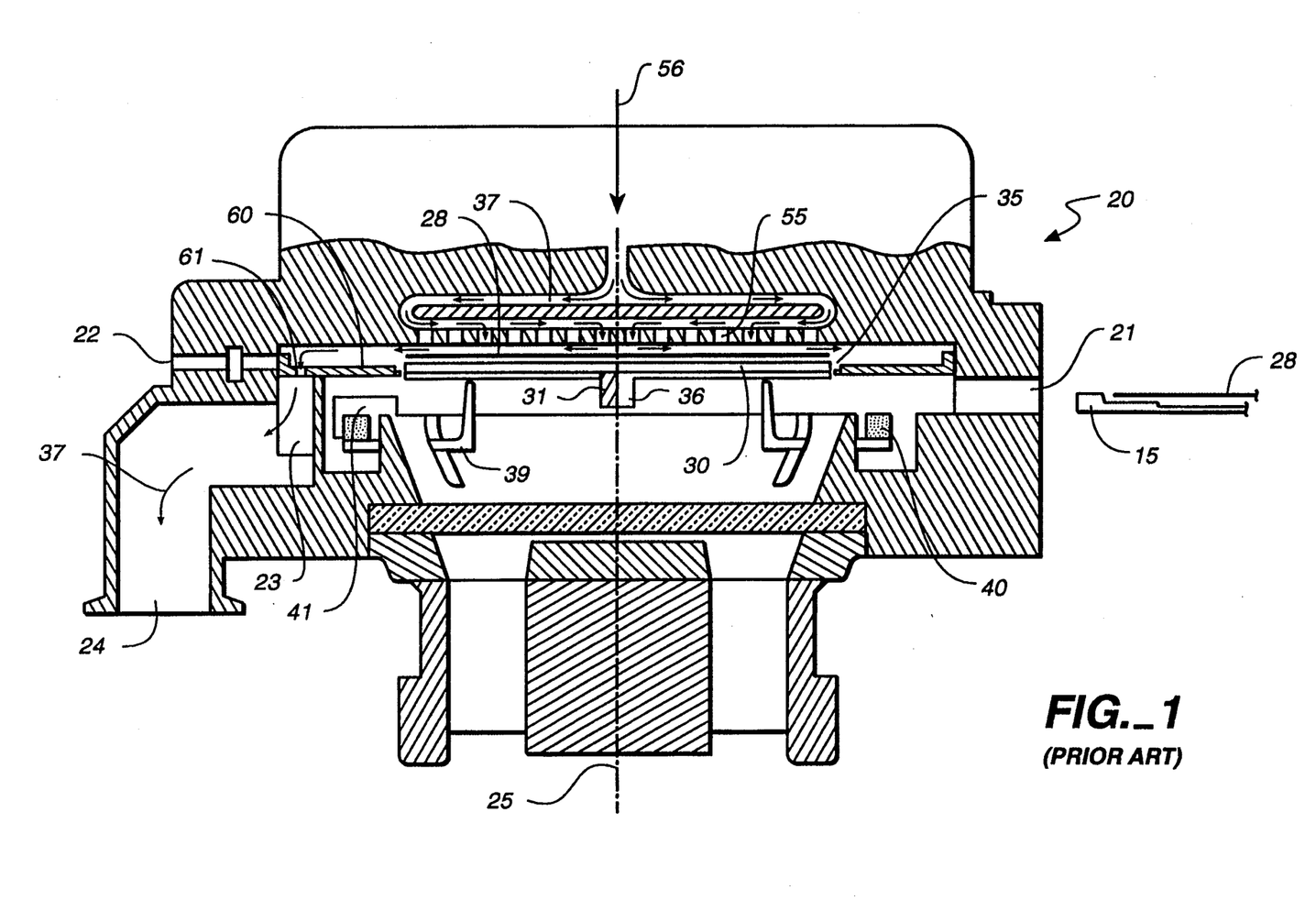
FIG. 1 is a partially sectioned side elevation view of a prior art process chamber.

FIG. 1 is a partially sectioned side elevation view of a prior art semiconductor process chamber that is used for such processes as chemical vapor deposition ("CVD").

As shown in FIG. 1, a semiconductor substrate 28 is loaded into a process chamber 20 through an opening 21 by a robot blade 15. A susceptor 30 is adapted to both support and heat the substrate, and to function as an electrode to which an RF voltage is applied to excite a plasma during substrate processing. The susceptor is supported by a central susceptor hub 36, while a susceptor support arm 31 coupled to a susceptor lift mechanism (not shown) supports the susceptor hub.

During substrate loading, the blade 15 inserts a substrate through the chamber opening 21 and positions the substrate directly above the susceptor 30. Two or more lift fingers 39 are positioned below a substrate transfer location. The lift fingers are supported by a lift finger support ring 40 and lift finger support mechanism 41. Once the substrate is properly positioned by the blade within the process chamber, the lift fingers 39 are raised to lift the substrate 28 from the robot blade 15. The blade is then retracted, and the chamber is sealed and pumped down with a vacuum pump to a desired processing pressure.

Once the substrate is positioned on the lift fingers, the susceptor is raised and brought into contact with the substrate. The susceptor then lifts the substrate along a process chamber central axis, as indicated by the numeric designator 25, until the substrate 28 is positioned at a substrate processing location.

During substrate processing, a process gas is pumped into the process chamber through a port 56 to an apertured gas distribution plate 55, also referred to as a shower head, that directs the process gas toward the substrate. The process gas is subjected to a strong electrical field that creates a plasma above the substrate, and produces a gas-phase chemical reaction which enhances substrate film deposition.

Figure 2:
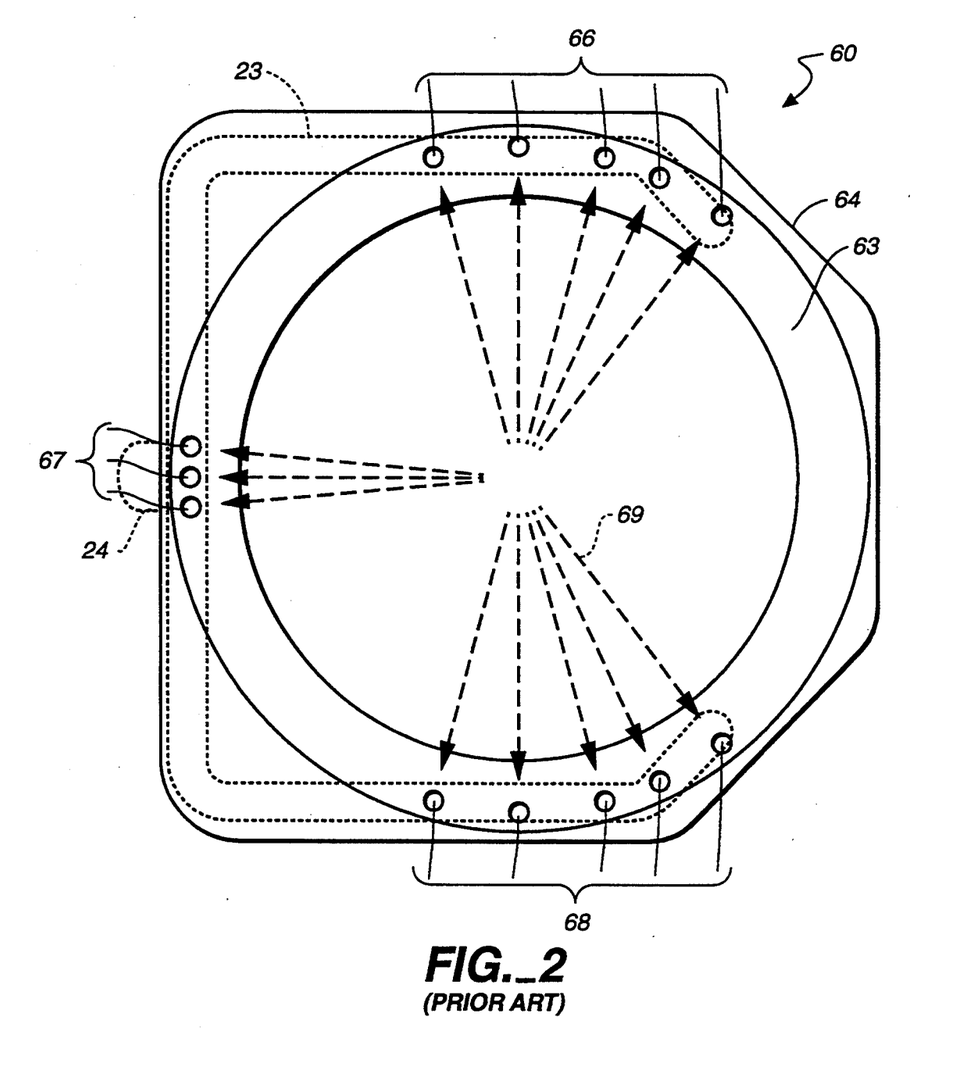
FIG. 2 is a plan view of a prior art exhaust baffle.

A series of arrows, some of which are identified by the numeric designator 37, show process gas flow within the process chamber. As shown in FIGS. 1 and 2, the process gas flows across the substrate surface, through apertures 61 formed in an exhaust baffle 60, and into an exhaust plenum 23 that partially surrounds the susceptor. The exhaust plenum 23 serves to minimize changes in exhaust pressure within the process chamber, and operates in conjunction with the apertured exhaust baffle to control gas extraction from the process chamber in a manner that distributes gas flow evenly across the substrate surface. The gas is then drawn from the exhaust plenum 23 into a vacuum conduit 24 by a vacuum pump (not shown). A close fit is provided between the adjacent edges 35 of the susceptor and the exhaust baffle to prevent process gas from flowing therebetween.

One source of undesirable nonuniformities in the gas flow pattern is chamber hardware which interrupts the symmetry and continuity of the exhaust plenum 23. For example, the substrate insertion opening 21 is located at the same elevation in the process chamber as the exhaust plenum 23, such that the continuity of the exhaust plenum is interrupted at the opening. Additionally, both the lift finger support mechanism 41 and the susceptor lift mechanism are located adjacent to the central core of the processing chamber at the same elevation in the process chamber as the exhaust plenum 23. Thus, the continuity of the exhaust plenum 23 is also interrupted to provide space for the lift finger support mechanism 41 and the susceptor lift mechanism. As a result, the exhaust plenum is typically arc shaped, having two ends that define a gap therebetween, such that the exhaust plenum does not completely surround the substrate, and such that it cannot draw process gas from the process chamber uniformly about the entire circumference of the substrate.

The prior art exhaust baffle 60, shown in FIG. 2, has a six-sided outer edge 64, and includes a circular ring portion 63 that has a plurality of apertures formed therethrough to allow process gas to flow to the exhaust plenum below. Two sets of apertures 66, 68 are positioned opposite each other on the exhaust baffle ring. The apertures are typically positioned equidistant from the center of the processing chamber. A third set of apertures 67 is positioned intermediate the other two sets of apertures on one side of the exhaust baffle ring.

The dashed arrows, identified in FIG. 2 by the numeric designator 69, show an expected gas flow path across the substrate surface to the apertures near the edge of the exhaust baffle 60 for gas introduced into the process chamber near the center of the gas distribution plate. As shown in the figure, process gas flow across the substrate surface to the apertures 66, 67, 68 leaves several arc sections of the substrate with little process gas cross flow, and only minimal exposure to gas molecules passing from adjacent areas. Although the entire substrate surface has some exposure to process gas, because the gas is pumped directly to the substrate surface from the gas distribution plate 55, the failure to distribute the process gas flow uniformly across the substrate surface is a significant cause of nonuniform film deposition on the substrate surface.

SUMMARY OF THE INVENTION

The invention improves the uniformity of flow of process gases across the surface of a semiconductor substrate during processing in a process chamber. The invention provides an exhaust baffle in which at least one of the apertures formed therethrough is adapted to provide an offset opening into the process chamber that extends the effective range of the exhaust plenum beyond its boundaries, and thereby provides a uniform process gas exhaust pattern that influences the process gas flow about the entire circumference of the substrate during substrate processing.

A preferred embodiment of the invention provides a compound exhaust baffle having two plate sections in facing abutment with one another that define at least one offset passage for conducting process gas from the process chamber from a region that is not directly accessible by the underlying exhaust plenum.

DETAILED DESCRIPTION OF THE INVENTION

Figure 3:
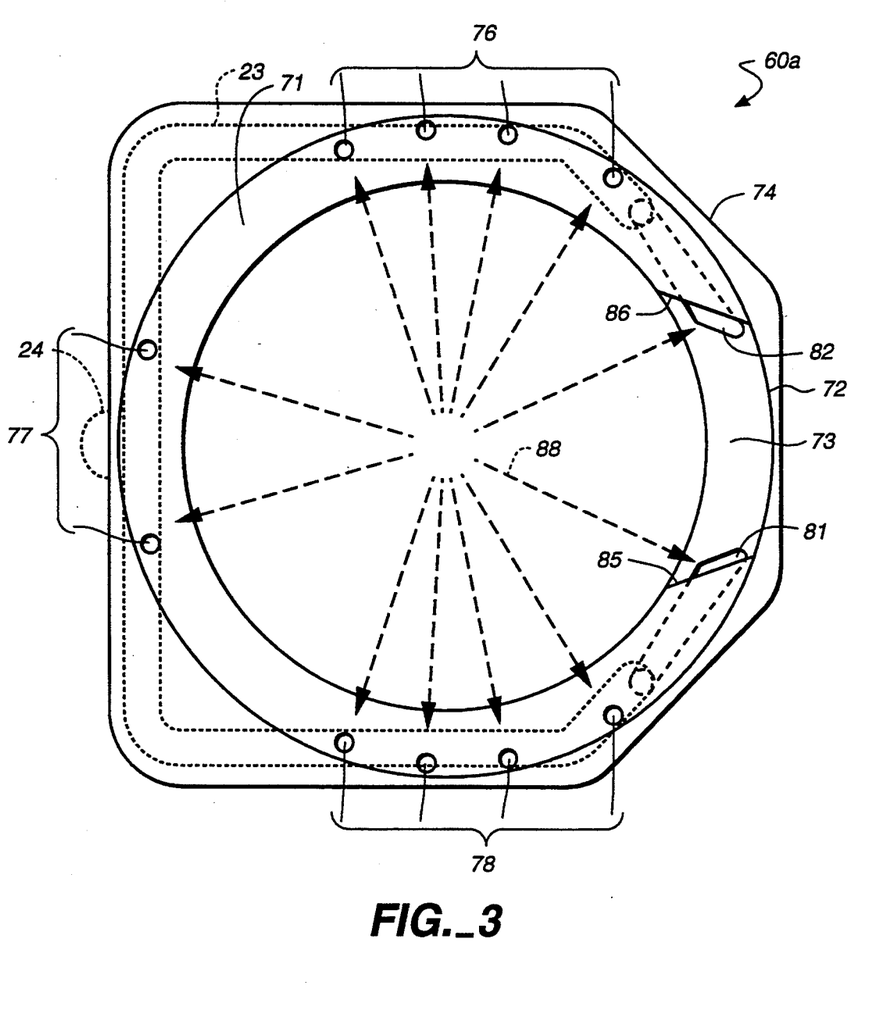
FIG. 3 is a plan view of a exhaust baffle according to the invention.

A typical process chamber, for example as is shown in FIG. 1, includes an exhaust baffle 60 surrounding a workpiece, such as semiconductor substrate 28. A plan view of an improved exhaust baffle 60a according to the invention is shown in FIG. 3. The exhaust baffle is shown positioned in a process chamber and superimposed over an exhaust plenum 23. The gas flow pattern across the improved exhaust baffle, indicated by the lines identified by the numeric designator 88, shows a substantially uniform distribution of process gas across the region of the substrate surface, in contrast to that of the prior art exhaust baffle, as shown in FIG. 2. The improved process gas flow pattern is achieved by the novel placement of apertures 76, 77, 78, and the inclusion of two offset apertures in the form of passages 81 and 82 that extend the exhaust plenum to an otherwise unavailable portion of the exhaust baffle surface, and thereby provide a uniform exhaust pattern that influences the process gas flow about the entire circumference of the substrate during substrate processing.

Figure 5:
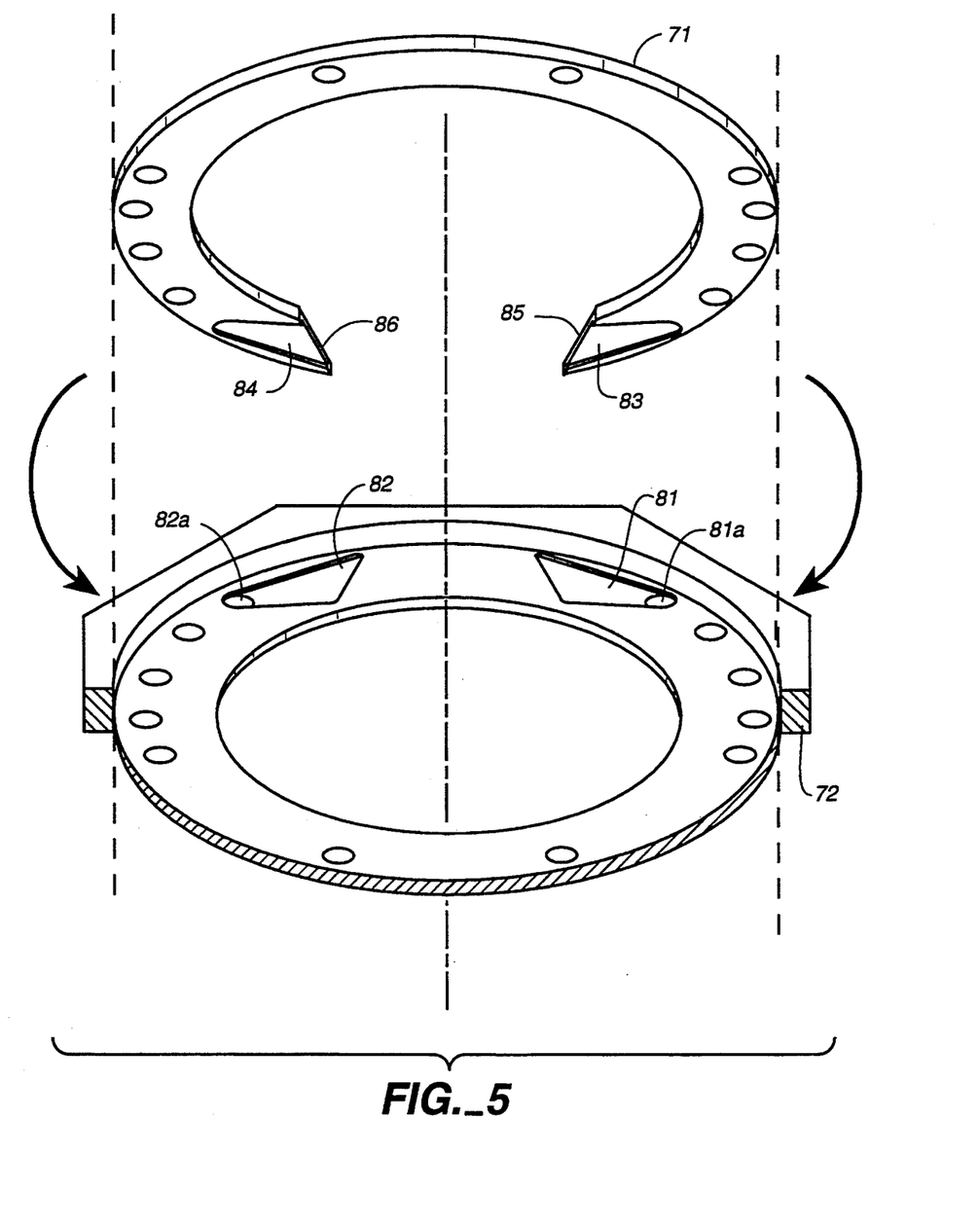
FIG. 5 is a partial assembly view of a top portion and a bottom portion of a twopiece exhaust baffle according to the invention.

The improved exhaust baffle 60a is a compound structure having a top portion 71 and a bottom portion 72 (please see FIG. 5). The exhaust baffle includes a six-sided border section 74 which acts as a perimeter flange around the circular bottom portion 72. Although the invention is described herein in connection with a six-sided process chamber, it will be readily understood by those skilled in the art that the invention is readily adapted for use with any process chamber configuration. Additionally, although a compound exhaust baffle is described herein, the exhaust baffle is readily fabricated by known techniques as any of a unitary or a compound structure.

Figure 4:
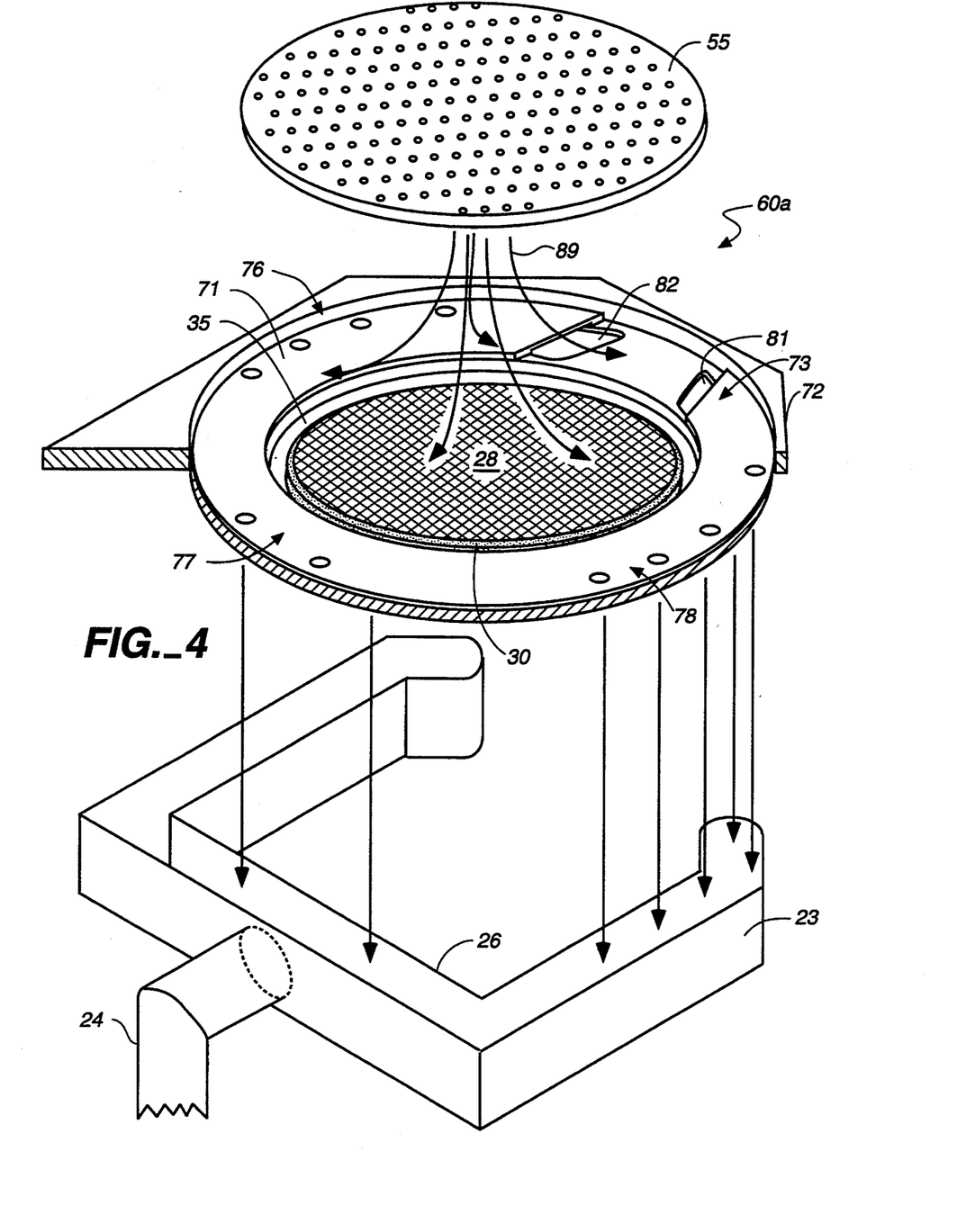
FIG. 4 is a partially sectioned, partially exploded, perspective view of a exhaust baffle according to the invention.
Figure 7:
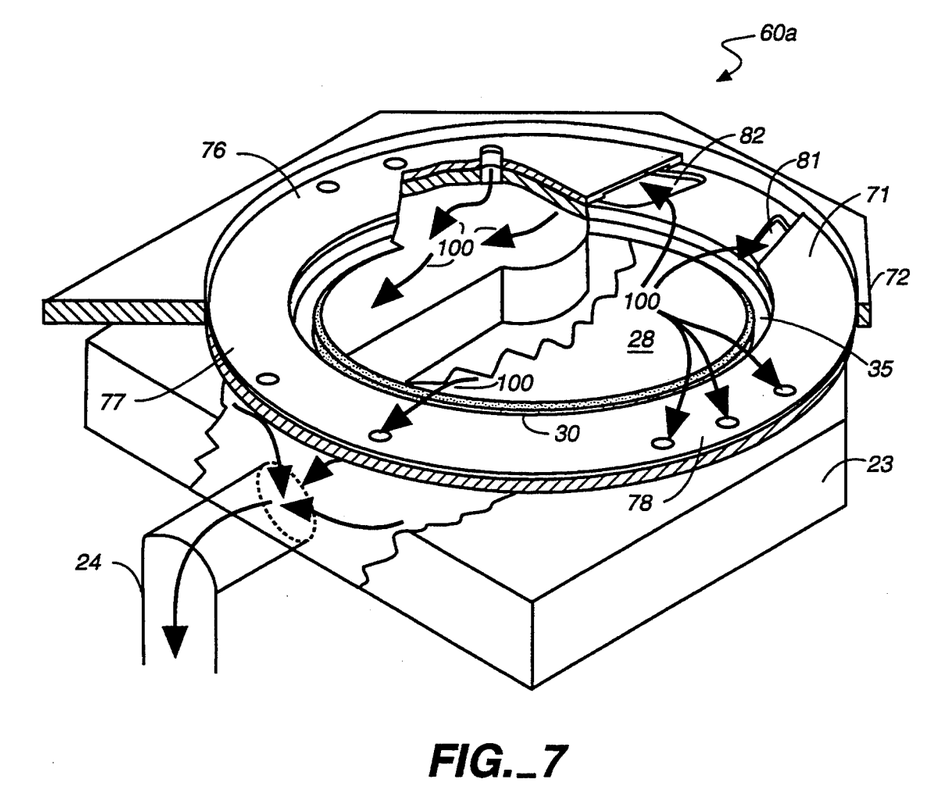
FIG. 7 is a partially sectioned, perspective view of an exhaust baffle and exhaust plenum showing process gas flow across a substrate surface and into offset exhaust baffle apertures formed according to the invention.

FIG. 4 is a partially sectioned perspective view of an exhaust baffle according to the invention. In the figure, process gas flow is shown by a series of arrows, as identified by the numeric designator 89. Thus, process gas enters the chamber from a gas inlet plate 55 spaced above the substrate 28 (also see FIG. 1). The gas flows across the surface of a substrate 28, and then through the apertures 76, 77, 78 and passages 81, 82 that are formed at the periphery of the circular ring portion 73 of the exhaust baffle 60a, and then to the exhaust plenum 23. Although not apparent from the exploded view in FIG. 4, FIGS. 1 and 7 show that the exhaust baffle 60a mounts directly on the exhaust plenum 23.

As shown in FIGS. 4-7, and especially in FIG. 5, compound exhaust baffle 60a includes a bottom portion 72 and a top portion 71. A bottom surface of the exhaust baffle bottom portion 72 abuts an upper exhaust plenum surface 26 to provide a substantially gas-tight seal therebetween. The baffle bottom portion 72 includes three sets of vacuum apertures 76, 77 and 78 formed therethrough and spaced in groups that are located approximately 90° apart.

The three sets of vacuum apertures 76, 77 and 78 are positioned directly above, and open directly into, the exhaust plenum. One set of vacuum apertures 77 is located intermediate the other two sets of vacuum apertures. As shown in FIGS. 1 and 4, the vacuum conduit 24 to a vacuum pump (not shown) is located at an intermediate portion of the exhaust plenum. Each aperture in the intermediate set of apertures is therefore situated proximate to the vacuum connection, while the other two sets of apertures are spaced from the vacuum connection. It is therefore preferable to space each of the intermediate apertures as far apart as is possible to prevent the intermediate apertures from excessively influencing the process gas flow, which otherwise would cause a negative pressure gradient in the adjacent region of the chamber.

Additionally, any or all of the apertures may be formed through the exhaust baffle such that the inner surface of the aperture, i.e. that portion of the exhaust baffle that defines the aperture, is oriented at an acute angle relative to the exhaust baffle surface, rather than at a right angle relative to the exhaust baffle surface as described above, such that the exhaust pressure exerted by the aperture is at least partially directed across the substrate surface. In this embodiment of the invention, forming the aperture with a more acute angle relative to the exhaust baffle surface, i.e. with an opening directed more toward the surface of the exhaust baffle, imparts more directionality across the surface of the exhaust baffle to the pressure exerted by the aperture, while forming the aperture with a less acute angle relative to the exhaust baffle surface, i.e. with an opening directed less toward the surface of the exhaust baffle, imparts less directionality across the surface of the exhaust baffle to the pressure exerted by the aperture. In this way, each aperture may be formed at a selected angle to exert optimum influence on process gas distribution across the substrate surface, thereby improving gas flow uniformity and, accordingly, process uniformity. Although the figures do not specifically show the angled apertures of this embodiment of the invention, it will be appreciated that the formation of such angled apertures is within the general level of skill in the art. For example, such apertures may be formed by boring a hole through the surface of the exhaust baffle on a drill press on which the workpiece table has been inclined.

The baffle bottom portion 72 also includes two passages 81/81a, 82/82a (also shown in FIGS. 5 and 6) that open into the exhaust plenum 23. A first baffle bottom passage 81 is shown connected to a related aperture 81a, while a second baffle bottom passage 82 is connected to a related aperture 82a. The passages 81, 82 are positioned about the exhaust baffle at a location that is substantially intermediate the two sets of vacuum apertures 76 and 78, and that is substantially opposite the third set of apertures 77. The passages 81, 82 should have smooth surfaces to prevent and/or minimize the deposition of process residues and byproducts within the passages; and to allow efficient cleaning of the passages, for example when the process chamber is cleaned. Additionally, the openings of one or both of the passages 81 and 82 may be oriented at an acute angle relative to the exhaust baffle and substrate surfaces, as described above, rather than at a right angle relative to these surfaces, such that the exhaust pressure exerted by the passage is at least partially directed across the substrate surface to exert optimum influence on process gas distribution across the substrate surface.

A "C" shaped exhaust baffle top portion 71 (also shown in FIGS. 5 and 6) includes a plurality of apertures formed therethrough that correspond to the three sets of apertures 76, 77, 78, which are formed in the baffle bottom portion. The baffle top portion 71 also includes a pair of passages 83, 84 that extend to the ends 85, 86 of the baffle top portion. The shape of the passages 83,84 is substantially identical to that of the baffle bottom portion passages 81, 82, except that the baffle bottom portion passages 81, 82 are preferably configured to extend beyond the ends 85 and 86 of the "C" shaped baffle top portion 71.

Figure 6:
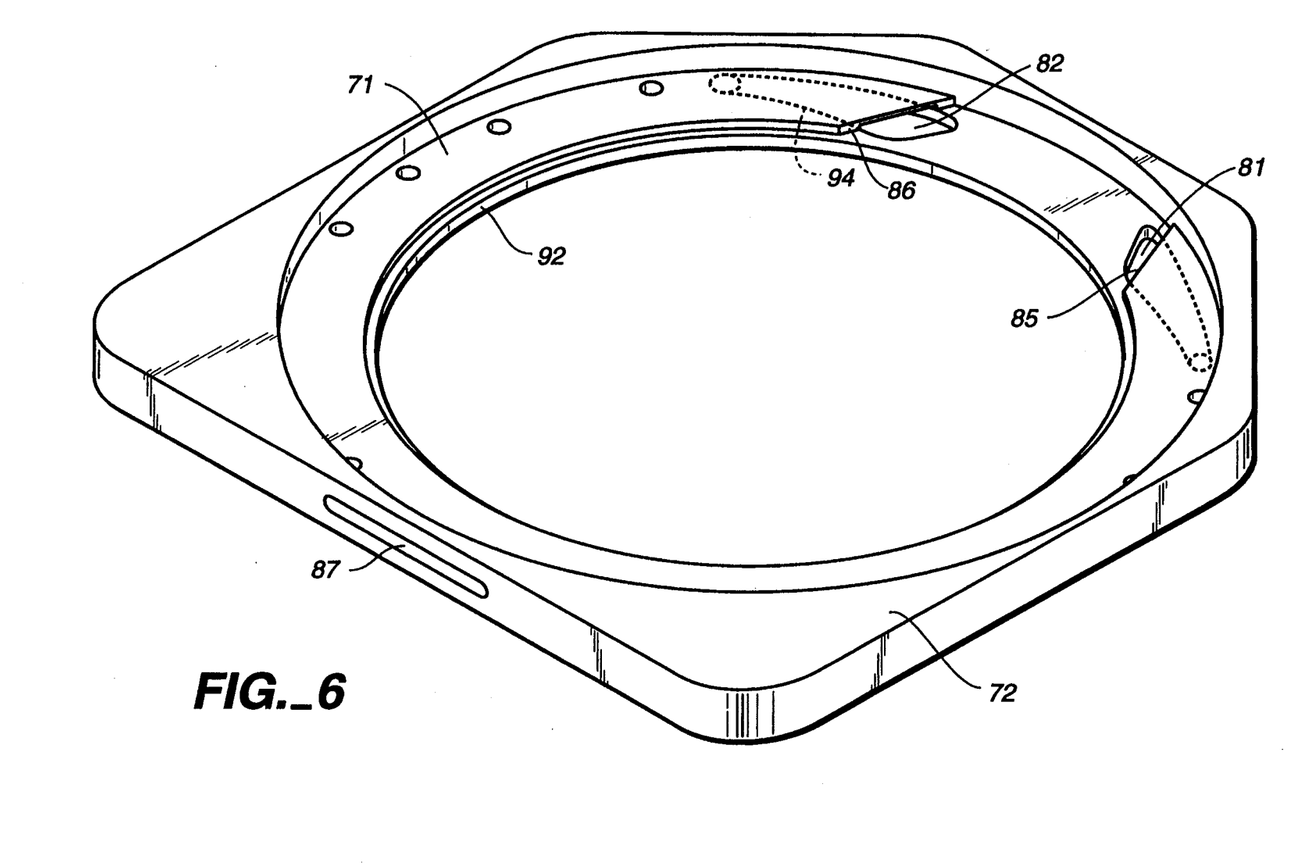
FIG. 6 is a perspective view of an assembled exhaust baffle according to the invention.

An outline of the process gas duct 94 formed by the top and bottom plate passages is shown in FIG. 6. It will be appreciated that the baffle top portion need not be "C" shaped, but may be formed in any shape that is appropriate for the application to which the invention is put. Additionally, the top and bottom baffle portions may be formed from multiple piece assemblies. Finally, more than one discrete upper or lower baffle portion may be provided.

A port 87 may be included in the exhaust baffle to allow an operator to view the plasma, for example through a process chamber view port 22 (FIG. 1). A flange 92 may also be formed in the exhaust baffle to minimize the gap 35 between the susceptor and the exhaust baffle, and thereby reduce the tendency of process gas to flow therebetween and into the exhaust plenum.

The exemplary exhaust baffle includes a bottom portion having an inside diameter of about 25.4 cm (10") and an outside diameter of about 32.5 cm (12.7") The depth of the passage 81 in the baffle bottom portion is about 0.5 cm (0.200"), and the sides and bottom of the passage formed therein have radii of about 0.32 cm (0.125"); while the depth of the passage 83 in the baffle top portion is approximately 0.13 cm (0.050"), and the sides and top of the passage formed therein have radii of about 0.05 cm (0.020"). The passages 81, 82, 83, 84 should have straight sides and rounded corners. The diameters of the bottom portion apertures 81a, 82a are about 1.3 cm (0.50") and exactly match the width of the passages 81, 82 at the point where the apertures and the passages coincide. The baffle bottom portion passages 81, 82 flare somewhat as they extend from the apertures 81a, 82a until they terminate as a wide, shallow slot having an open end that may be configured to face partially toward the substrate surface. The diameter of the apertures 76, 78, 77 is about 0.95 cm (0.375").

The baffle top and bottom portions may be held together in registered contact with screws, nut and bolts, adhesives, or by welding. The baffle top and bottom portions may be fabricated from aluminum, Kovar®, or any other process compatible materials by casting, stamping, molding, or machining, as appropriate.

FIG. 7 is a partially sectioned, perspective view of an exhaust baffle and exhaust plenum showing process gas flow across a substrate surface and into offset exhaust baffle apertures formed according to the invention. During substrate processing, process gas flows from the perforated gas inlet plate 55 toward the substrate 28 in the general direction shown in FIG. 4 by arrows identified by numeric designator 89. As shown in FIGS. 4 and 7, process gas is drawn in the exhaust plenum 23 surrounding the substrate 28 through the three sets of apertures 76, 77, 78, and through the passages 81 and 82 (as best seen in FIG. 7 with reference to the arrows identified by numeric designator 100). The arrangement of the three sets of apertures and the two passages distributes exhaust pressure uniformly about the circumference of the substrate, and thereby effect uniform distribution of gas flow within the process chamber.

The novel exhaust baffle described herein allows uniform gas flow across the substrate surface during substrate processing, resulting in greatly improved uniformity in deposited film composition and thickness. The refractive index of the deposited film, which is expressed as the ratio of the velocity of light in free space to the velocity of light in a given medium, i.e. the film, and which is a standard measure of the uniformity of the film composition and thickness, was used to evaluate the improvement in deposited film composition uniformity achieved when using a exhaust baffle according to the invention herein described.

Figure 8:
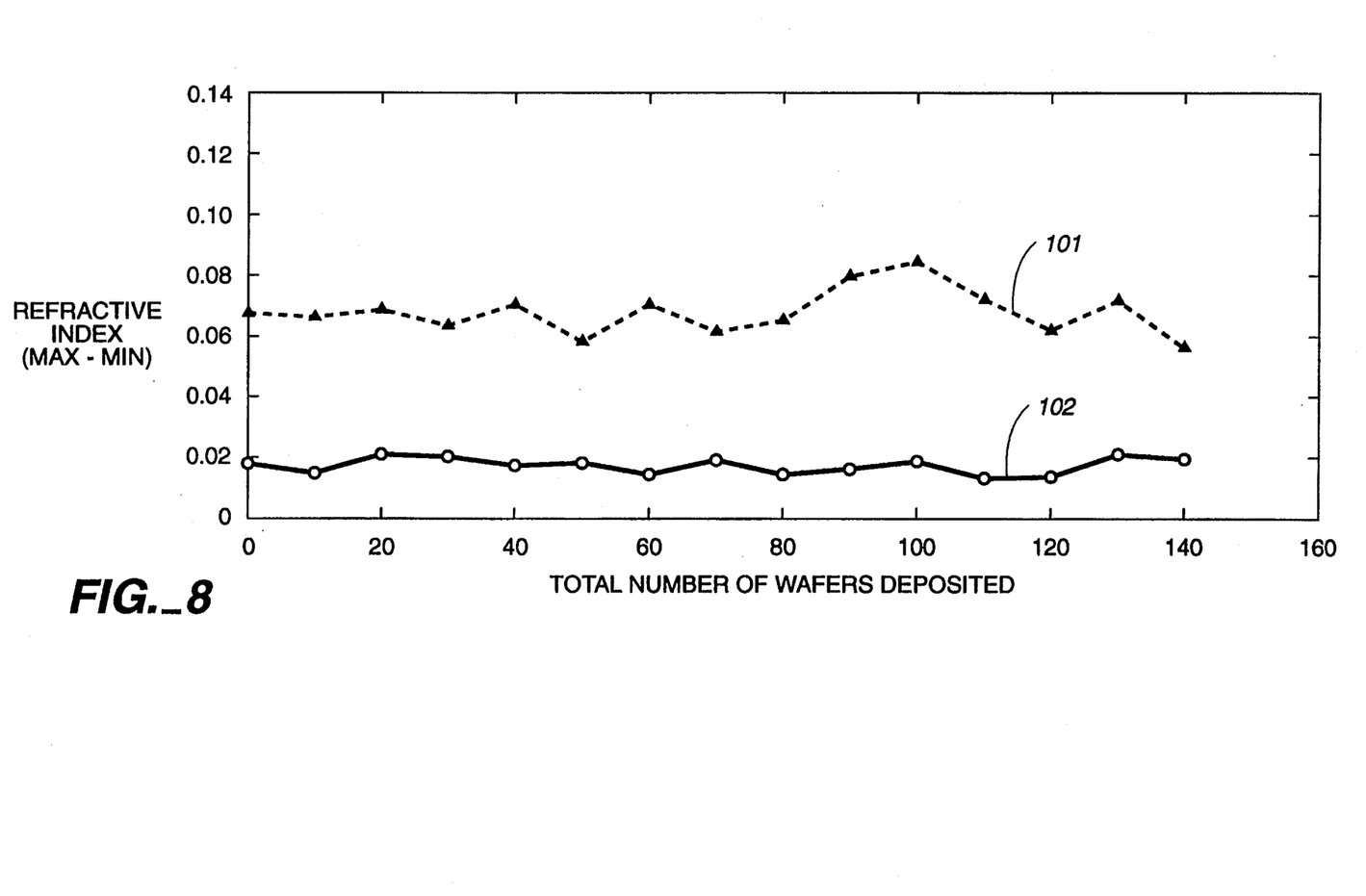
FIG. 8 is a graph showing substrate refractive index for several substrates in which a first line plots refractive index for substrates that have been processed in accordance with the prior art, and in which a second line plots refractive index for substrates that have been processed in accordance with the invention.

FIG. 8 is a graph showing substrate refractive index for several substrates in which a first line 101 plots refractive index for substrates that have been processed in accordance with the prior art, and in which a second line 102 plots refractive index for substrates that have been processed in accordance with the invention. The refractive index of a deposited film was measured at five points on a substrate, i.e. at the center of the substrate and at four other locations equally spaced from the center of the substrate approximately 1.5 cm from the substrate edge, and which form the corners of a square centered on the substrate. The measurements obtained were subjected to a calculation in which a maximum refractive index value was subtracted from a minimum refractive index value to produce a maximum-minus-minimum value for each substrate To obtain the values shown on FIG. 8, 140 substrates each were processed using a prior art exhaust baffle and an exhaust baffle according the invention herein described. Measurements made for every tenth substrate were plotted. The upper curve 101 plots the difference in refractive indexes found when using the prior art exhaust baffle shown in FIG. 3. The lower curve 102 plots the same measurements when using an exhaust baffle according to the invention, as shown in FIG. 4. It can be seen in the figure that the exhaust baffle according to the invention is produces a deposited film having a lower refractive index in which variance from substrate to substrate is less. Thus, there is both a substantial improvement in the uniformity of process gas flow across the substrate surface, thereby improving the uniformity of deposited film composition and thickness across the surface of each individual substrate; and there is less variance in refractive index from substrate to substrate. Accordingly, the invention is instrumental in producing a substrate on which the individual devices across the substrate, from the substrate edge to the substrate center, exhibit substantially the same electrical performance.

Deposition process conditions for substrates from which these measurements were taken include the following: a 200 mm diameter substrate; having a susceptor temperature of 400° C., and a substrate temperature of approximately 376° C.; a maximum process time of 56 seconds; a chamber pressure maintained at 4.2 Torr; and process gas constituents and flow of $SiH_4$-270 sccm, $N_2$-4000 sccm and $NH_3$ 120 sccm. After several process cycles, e.g. 5–10, the process chamber is cleaned using a mixture of $CF_4$ at a flow of 2200 sccm and $N_2O$ flowing at 733 sccm.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. An apparatus for controlling process gas distribution across the surface of a semiconductor substrate in a semiconductor process chamber, comprising:

an arc shaped exhaust plenum that is coupled to a process chamber vacuum system, and through which said process gas is evacuated from said process chamber, said exhaust plenum having two ends that define a gap therebetween which is not directly accessible by said exhaust plenum;

a baffle overlying said exhaust plenum, said baffle having at least one set of apertures formed therein through which said process gas may be drawn from said process chamber directly to said exhaust plenum; and said baffle comprising at least one passage that is in communication with, and offset from, said exhaust plenum to draw said process gas from said gap;

whereby said apertures and said passage communicate with said underlying exhaust plenum to improve gas flow uniformity across said substrate surface during substrate processing.

2. The baffle of claim 1, wherein at least one of said apertures and said passage are adapted to draw said process gas across said substrate surface at an acute angle relative thereto.

3. The baffle of claim 1, wherein said passage has a generally circular configuration at a baffle exhaust plenum surface, and wherein said passage flares therefrom to assume a generally slotted configuration at a baffle upper surface.

4. The baffle of claim 1, wherein said passage is configured to face partially toward said substrate surface.

5. The apparatus of claim 1, said baffle further comprising:

a bottom baffle portion located adjacent to said exhaust plenum; and a top baffle portion in abutting engagement with said bottom baffle portion;

wherein said bottom baffle portion includes a lower portion of said set of apertures and said passage, and said top baffle portion includes a corresponding upper portion of said set of apertures and said passage.

6. The baffle of claim 5, wherein said top baffle portion is generally "C" shaped, said passage opening to said baffle at an open end of said "C".

7. A process gas distribution baffle for a semiconductor process chamber, comprising:

a baffle configured to abut and cover an underlying process chamber exhaust plenum, said baffle having at least one aperture formed therethrough connecting said exhaust plenum to said process chamber, wherein said aperture is adapted to draw process gas across a substrate surface at an acute angle relative thereto.

8. The baffle of claim 7, wherein said aperture is adapted to draw a process gas from a region that is not directly accessible by said underlying exhaust plenum.

9. A process gas baffle for a semiconductor process chamber, comprising:

a first baffle portion covering an arc shaped process chamber exhaust plenum, said exhaust plenum having two ends that define a gap therebetween that is not directly accessible by said exhaust plenum, said first baffle portion having a first set of apertures formed therethrough at selected locations, and adapted to draw process gas from a first baffle portion upper surface into the exhaust plenum, said first baffle portion including a passage formed therethrough that is separate from said first set of apertures, said passage adapted to channel process gas from a location on said first baffle portion upper surface to a second location on a first baffle portion lower surface, wherein said second location is disposed adjacent to said exhaust plenum and said first location is disposed adjacent to said process chamber; and a second baffle portion covering at least a portion of said first baffle portion, said second baffle portion having a second set of apertures formed therethrough, such that placing said second baffle portion in registered contact with and adjacent to said first baffle portion substantially aligns said second set of apertures with said first said of apertures; said second baffle portion adapted to enclose a portion of said passage such that process gas is drawn through said passage between a lower surface of said second baffle portion and said upper surface of said first baffle portion.

10. A process gas distribution apparatus for a semiconductor process chamber, comprising:

a baffle substantially covering an arc shaped process chamber exhaust plenum having two ends that define a gap therebetween that is not directly accessible by said exhaust plenum, said baffle including a passage formed therethrough and adapted to route a vacuum from said exhaust plenum to a location on a surface of said baffle that coincides with said gap.

11. The apparatus of claim 10, wherein said baffle further comprises:

a ring-shaped lower baffle portion adapted to surround a substrate during substrate processing; and a "C" shaped upper baffle portion having an end terminating above said passage.

12. The baffle of claim 11, wherein said upper baffle portion includes a slot facing said passage, said slot opening to said end of said "C" shaped upper baffle portion and terminating above said passage.

13. A method for controlling process gas distribution across a semiconductor substrate surface in a semiconductor process chamber, comprising the steps of:
 substantially covering an underlying arc shaped exhaust plenum having two ends that define a gap therebetween that is not directly accessible by said exhaust plenum, and that is coupled to a process chamber vacuum system with a baffle through which said process gas is evacuated from said process chamber;
 drawing process gas directly from said process chamber into said exhaust plenum through at least one set of apertures formed through said baffle; and
 drawing said process gas from said gap through at least one passage formed through said baffle and that is in communication with, and offset from, said exhaust plenum;
 wherein said apertures and said passage communicate with said underlying exhaust plenum to generate a uniform gas flow across said substrate surface during substrate processing.

14. The method of claim 13, wherein at least one of said apertures and said passage are adapted to draw said process gas across said substrate surface at an acute angle relative thereto.

15. The method of claim 13, wherein said passage has a generally circular configuration at a baffle exhaust plenum surface, and wherein said passage flares therefrom to assume a generally slotted configuration at a baffle upper surface.

16. The method of claim 13, wherein said passage is configured to face partially toward said substrate surface.

17. The method of claim 13, wherein said baffle comprises:
 a bottom baffle portion located adjacent to said exhaust plenum; and
 a top baffle portion in abutting engagement with said bottom baffle portion; and
 wherein said bottom baffle portion includes a lower portion of said set of apertures and said passage, and said top baffle portion includes a corresponding upper portion of said set of apertures and said passage.

18. The method of claim 17, wherein said top baffle portion is generally "C" shaped, said passage opening to said baffle at an open end of said "C".

19. A process gas distribution apparatus for a semiconductor process chamber, comprising:
 an arc shaped exhaust plenum having two ends that define a gap therebetween that is not directly accessible by said exhaust plenum, and that is adapted to provide a nearly constant exhaust pressure about at least a portion of a substrate circumference; and
 a baffle substantially covering said exhaust plenum, said baffle including a passage formed therethrough and adapted to route the exhaust pressure from said exhaust plenum to said gap.

* * * * *